US012689371B1

(12) United States Patent
Zhong et al.

(10) Patent No.: US 12,689,371 B1
(45) Date of Patent: Jul. 21, 2026

(54) MULTI-SLOPE SWITCHING CIRCUIT FOR SWITCHED-CAPACITOR SIGNAL INTEGRATOR

(71) Applicant: QUALCOMM Incorporated, San Diego, CA (US)

(72) Inventors: Xiaopeng Zhong, Seattle, WA (US); Liang Dai, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 19/075,064

(22) Filed: Mar. 10, 2025

(51) Int. Cl.
| | |
|---|---|
| *H03K 5/01* | (2006.01) |
| *H03H 19/00* | (2006.01) |
| *H03K 17/687* | (2006.01) |

(52) U.S. Cl.
CPC ....... *H03K 17/6872* (2013.01); *H03H 19/004* (2013.01); *H03K 5/01* (2013.01)

(58) Field of Classification Search
CPC ..... H03H 19/004; H03K 5/01; H03K 17/6872
USPC ................................................. 327/336, 337
See application file for complete search history.

(56) References Cited

U.S. PATENT DOCUMENTS

| | | | | | |
|---|---|---|---|---|---|
| 5,057,839 | A | * | 10/1991 | Koch | H03M 3/47 |
| | | | | | 341/172 |
| 5,703,589 | A | * | 12/1997 | Kalthoff | H03M 3/34 |
| | | | | | 341/172 |
| 6,147,522 | A | * | 11/2000 | Rhode | H03M 3/368 |
| | | | | | 327/93 |

| | | | | | |
|---|---|---|---|---|---|
| 6,204,787 | B1 | * | 3/2001 | Baird | H03M 3/488 |
| | | | | | 341/139 |
| 6,445,331 | B1 | * | 9/2002 | Stegers | G06G 7/1865 |
| | | | | | 341/172 |
| 6,617,908 | B1 | * | 9/2003 | Thomsen | H03F 3/005 |
| | | | | | 327/337 |
| 6,653,967 | B2 | * | 11/2003 | Hamashita | H03M 3/496 |
| | | | | | 341/172 |
| 6,956,514 | B1 | | 10/2005 | Melanson et al. | |
| 7,102,558 | B2 | * | 9/2006 | Deval | H03M 3/434 |
| | | | | | 341/172 |
| 7,167,119 | B1 | * | 1/2007 | Lei | H03M 3/342 |
| | | | | | 341/172 |
| 7,843,232 | B2 | * | 11/2010 | Farhat | G11C 27/026 |
| | | | | | 327/91 |
| 2008/0143570 | A1 | | 6/2008 | Andersson et al. | |

(Continued)

OTHER PUBLICATIONS

International Search Report and Written Opinion—PCT/US2026/016201—ISA/EPO—Jun. 2, 2026.

*Primary Examiner* — William Hernandez
(74) *Attorney, Agent, or Firm* — Loza & Loza, LLP

(57) ABSTRACT

An apparatus, including: an integrator including a first input and a second input; and a switched-capacitor, comprising: a first capacitor; a first multi-slope switching circuit coupled to a first plate of the first capacitor; a first switching device coupled between a second plate of the first capacitor and a common mode node; a second switching device coupled between the second plate of the first capacitor and the first input of the integrator; a second capacitor; a second multi-slope switching circuit coupled to a first plate of the second capacitor; a third switching device coupled between a second plate of the second capacitor and the common mode node; and a fourth switching device coupled between the second plate of the second capacitor and the second input of the integrator.

20 Claims, 7 Drawing Sheets

(56) References Cited

U.S. PATENT DOCUMENTS

| | | | | |
|---|---|---|---|---|
| 2018/0076779 | A1 | 3/2018 | Wang et al. | |
| 2024/0356507 | A1* | 10/2024 | Ganta | H03F 3/45968 |
| 2026/0095135 | A1* | 4/2026 | He | H03F 3/45475 |

* cited by examiner (SAMPLING PHASE)

(INTEGRATION PHASE)

MULTI-SLOPE SWITCHING CIRCUIT FOR SWITCHED-CAPACITOR SIGNAL INTEGRATOR

FIELD

This disclosure relates generally to signal integrators, and in particular, to a multi-slope switching circuit for a switched-capacitor integrator.

BACKGROUND

Switched-capacitor integrators may be used in many applications. A switched-capacitor integrator includes a switched-capacitor coupled to an input of an integrator. The switched-capacitor is configured to sample an input voltage by charging a capacitor with the input voltage. Then, the charged capacitor is coupled to the integrator to transfer charges to the integrator so that it can perform the integration of the input voltage to generate an output voltage. The charging and discharging of the input capacitor involve operating switching devices coupled to both plates of the input capacitor. In some cases, the charging of the input capacitor may cause leakage current through one or more switching devices, which may produce error in the integration of the input voltage.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus, includes: an integrator including a first input and a second input; and a switched-capacitor, comprising: a first capacitor; a first multi-slope switching circuit coupled to a first plate of the first capacitor; a first switching device coupled between a second plate of the first capacitor and a common mode node; a second switching device coupled between the second plate of the first capacitor and the first input of the integrator; a second capacitor; a second multi-slope switching circuit coupled to a first plate of the second capacitor; a third switching device coupled between a second plate of the second capacitor and the common mode node; and a fourth switching device coupled between the second plate of the second capacitor and the second input of the integrator.

Another aspect of the disclosure relates to a method of processing first and second differential voltages. The method includes: in accordance with a first phase of operation: performing a first voltage transition at a first plate of a first capacitor from the second differential voltage to the first differential voltage; and performing a second voltage transition at a second plate of a second capacitor from the first differential voltage to the second differential voltage with a first slope for a first portion of the second voltage transition and with a second slope for a second portion of the second voltage transition, the first slope being different than the second slope.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. The term "substantially" means that the associated parameter may not be exact as indicated but accounts for some variation due to specified tolerances.

Figure 1:
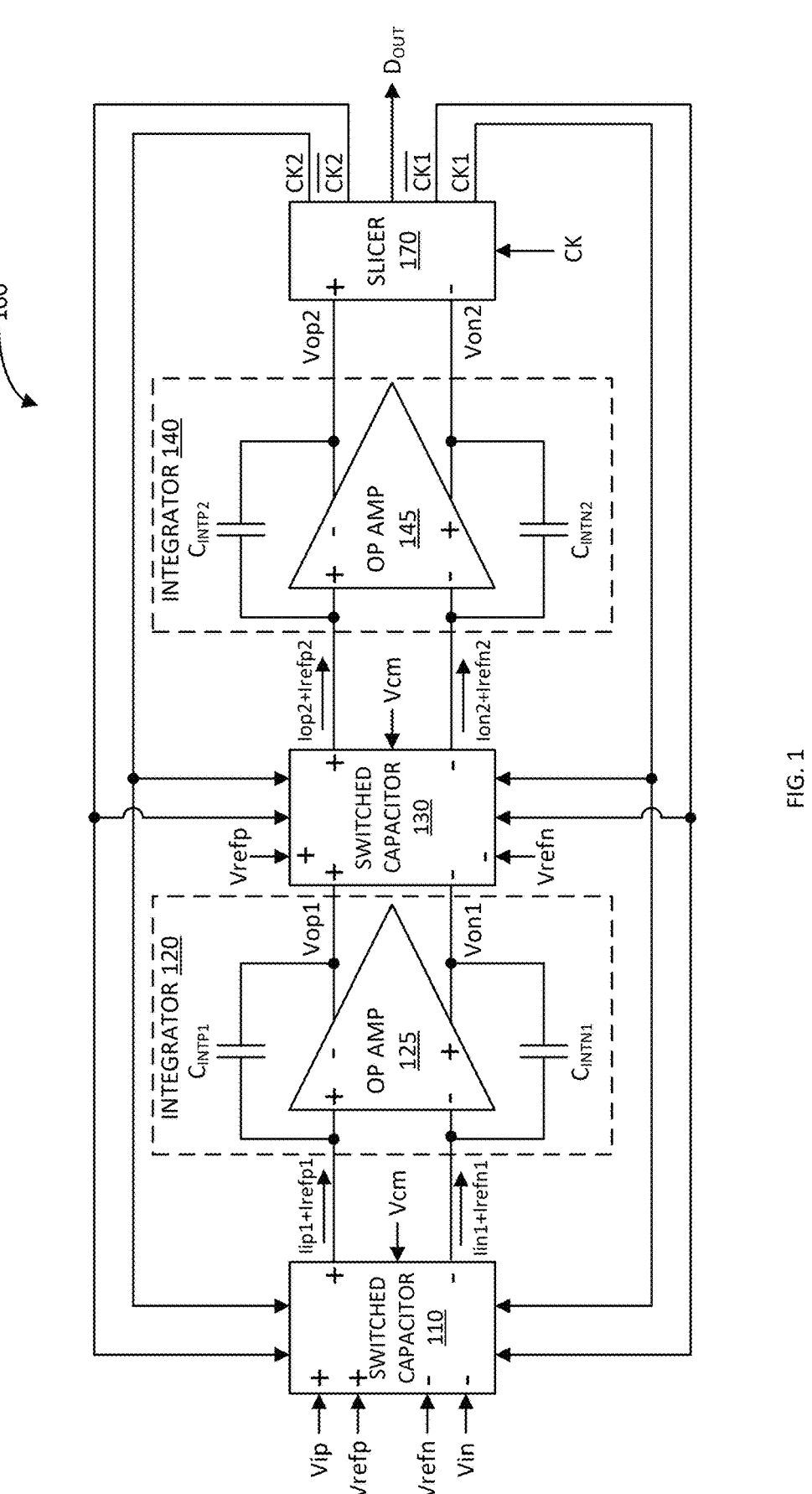
FIG. 1 illustrates a block diagram of an example switched-capacitor sigma-delta analog-to-digital converter (ADC) in accordance with an aspect of the disclosure.

FIG. 1 illustrates a block diagram of an example switched-capacitor sigma-delta analog-to-digital converter (ADC) 100 in accordance with an aspect of the disclosure. The sigma-delta ADC 100 includes a first switched-capacitor 110, a first integrator 120, a second switched-capacitor 130, a second integrator 140, and a slicer 170. The first integrator 120, in turn, includes a first operational amplifier 125 and a first set of differential feedback capacitors $C_{INTP1}$/$C_{INTN1}$. Similarly, the second integrator 140, in turn, includes a second operational amplifier 145 and a second set of differential feedback capacitors $C_{INTP2}$/$C_{INTN2}$.

More specifically, the first switched-capacitor 110 includes a first differential input (+/−) configured to receive a differential input signal Vip/Vin, respectively. The first switched-capacitor 110 includes a second differential input (+/−) configured to receive a differential reference voltage Vrefp/Vrefn, respectively. Further, the first switched-capacitor 110 includes an input configured to receive a common mode voltage Vcm. The first switched-capacitor 110 includes a set of clock inputs coupled to a set of clock outputs of the slicer 170 to receive first complementary clock signals CK1/$\overline{\text{CK1}}$ and the second complementary clock signals CK2/$\overline{\text{CK2}}$, respectively.

As discussed further herein, the first switched-capacitor 110 is configured to sample the differential signal Vip/Vin and the differential reference voltage Vrefp/Vrefn based on the first complementary clock signals CK1/$\overline{\text{CK1}}$. The first switched-capacitor 110 is configured to output a sum of the sampled differential input signal Vip/Vin and the sampled differential reference voltage Vrefp/Vrefn as a first differential current (Iip1+Irefp1)/(Iin1+Irefn1) at a differential output (+/−) thereof based on the second complementary clock signals CK2 and $\overline{\text{CK2}}$, respectively.

The first operational amplifier 125 includes a differential input (+/−) coupled to the differential output (+/−) of the first switched-capacitor 110. The first positive-side (p-side) feedback capacitor $C_{INTP1}$ is coupled between a negative output (−) and the positive input (+) of the first operational amplifier 125. The first negative-side (n-side) feedback capacitor $C_{INTN1}$ is coupled between a positive output (+) and the negative input (−) of the first operational amplifier 125. The first integrator 120 is configured to integrate the first differential current (Iip1+Irefp1)/(Iin1+Irefn1) to generate a first differential output signal Vop1/Von1 at the differential output (+/−) of the first operational amplifier 125, respectively.

The second switched-capacitor 130 includes a first differential input (+/−) coupled to the differential outputs (−/+) of the first operational amplifier 125 to receive the first differential output signal Vop1/Von1, respectively. The second switched-capacitor 130 includes a second differential input (+/−) to receive the differential reference voltage Vrep/Vrefn, respectively. The second switched-capacitor 130 also includes an input to receive the common mode voltage Vcm. Further, the second switched-capacitor 130 includes a set of clock inputs coupled to the set of clock outputs of the slicer 170 to receive first complementary clock signals CK1/$\overline{\text{CK1}}$ and the second complementary clock signals CK2/$\overline{\text{CK2}}$, respectively.

The second switched-capacitor 130 is configured to sample the first differential output signal Vop1/Von1 and the differential reference voltage Vrefp/Vrefn based on the second complementary clock signals CK2/$\overline{\text{CK2}}$. The second switched-capacitor 130 is configured to output a sum of the sampled first differential output signal Vop1/Von1 and the sampled differential reference voltage Vrefp/Vrefn as a second differential current (Iop2+Irefp2)/(Iop2+Irefn2) at differential output (+/−) thereof based on the first complementary clock signals CK1 and CK1, respectively.

The second operational amplifier 145 includes a differential input (+/−) coupled to the differential output (+/−) of the second switched-capacitor 130. The second p-side feedback capacitor $C_{INTP2}$ is coupled between a negative output (−) and the positive input (+) of the second operational amplifier 145. The second n-side feedback capacitor $C_{INTN2}$ is coupled between a positive output (+) and the negative input (−) of the second operational amplifier 145. The second integrator 140 is configured to integrate the second differential current (Iop2+Irefp2)/(Ion2+Irefn2) to generate a second differential output signal Vop2/Von2 at the differential output (+/−) of the second operational amplifier 145, respectively.

The slicer 170 is configured to generate an output data signal Dour based on the second output differential signal Vop2/Von2 at a sampling rate related to a frequency of a base clock signal CK. The slicer 170 is further configured to generate the first complementary clock signals CK1/$\overline{\text{CK1}}$ and the second complementary clock signals CK2/$\overline{\text{CK2}}$ based on the base clock signal CK. Although, in this example, the switched-capacitor sigma-delta ADC 100 includes two switched-capacitors/integrators to provide a second-order integration, it shall be understood that the switched-capacitor sigma-delta ADC 100 may include more or less than two switched-capacitors/integrators to provide a different order of integration.

Figure 2A:
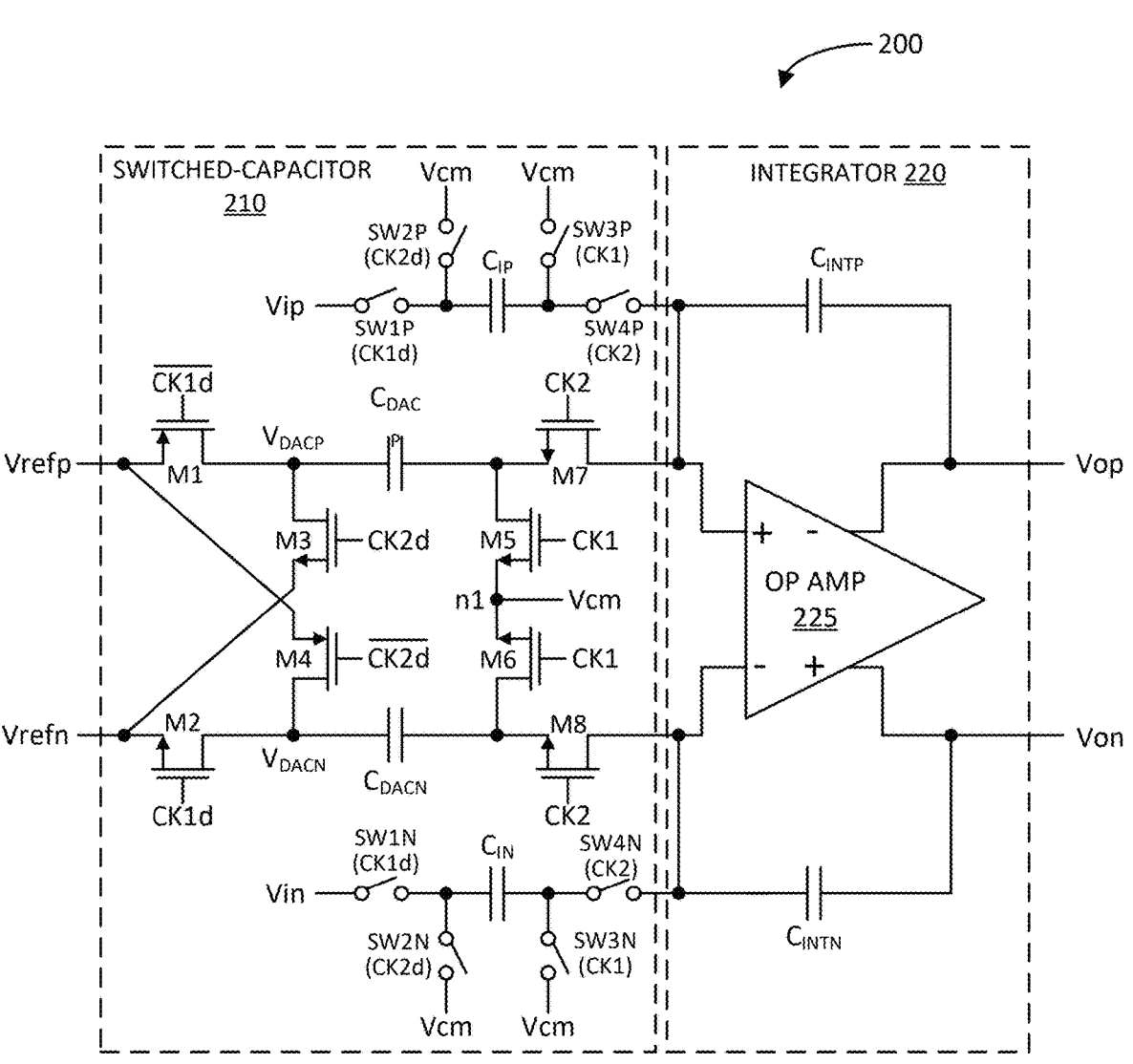
FIG. 2A illustrates a schematic diagram of an example switched-capacitor signal integrator in accordance with another aspect of the disclosure.

FIG. 2A illustrates a schematic diagram of an example switched-capacitor integrator 200 in accordance with another aspect of the disclosure. The switched-capacitor signal integrator 200 may be an example implementation of any of the switched-capacitor 110/integrator 120 or switched-capacitor 130/integrator 140 previously discussed. The switched-capacitor signal integrator 200 includes a switched-capacitor 210 and an integrator 220.

The switched-capacitor 210 includes a set of p-channel field effect transistors (PFETs) M1 and M4 and a set of n-channel field effect transistors (NFETs) M2-M3 and M5-M8. The PFETs M1 and M4 and NFETs M2-M3 and M5-M8 operate as switching devices as discussed further herein. The switched-capacitor 210 further includes first input differential capacitors $C_{DACP}$/$C_{DACN}$. The switched-capacitor 210 further includes a set of p-side input switching devices SW1P-SW4P, a second p-side input capacitor $C_{IP}$, a set of n-side input switching devices SW1N-SW4N, and a second n-side input capacitor $C_{IN}$. The integrator 220 includes an operational amplifier 225 and differential feedback capacitors $C_{INTP}$/$C_{INTN}$.

The PFET M1 includes a source configured to receive a positive component Vrefp of a differential reference voltage Vrefp/Vrefn (e.g., generated by a differential reference voltage source), a gate configured to receive a first delayed complementary clock signal $\overline{\text{CK1}d}$ (e.g., the first complementary clock signal $\overline{\text{CK1}}$ from the slicer 170 slightly delayed by a delay element (not shown)), and a drain coupled to a first (e.g., negative) plate of the first p-side input capacitor $C_{DACP}$. The NFET M2 includes a source configured to receive a negative component Vrefn of the differential reference voltage Vrefp/Vrefn, a gate configured to receive a first delayed non-complementary clock signal CK1$d$ (e.g., the first non-complementary clock signal CK1 from the slicer 170 slightly delayed by a delay element (not shown)), and a drain coupled to a first (e.g., negative) plate of the first n-side input capacitor $C_{DACN}$.

The NFET M3 includes a drain coupled to the first plate of the first p-side input capacitor $C_{DACP}$, a gate configured to receive a second delayed non-complementary clock signal CK2$d$ (e.g., the second non-complementary clock signal CK2 from the slicer 170 slightly delayed by a delay element (not shown)), and a source coupled to the source of the NFET M2 (e.g., and also configured to the negative component Vrefn of the input differential reference voltage Vrefp/Vrefn). The PFET M4 includes a source coupled to the source of the PFET M1 (e.g., and also configured to the positive component Vrefp of the input differential reference voltage Vrefp/Vrefn), a gate configured to receive a second delayed complementary clock signal $\overline{CK2d}$ (e.g., the second complementary clock signal CK2 from the slicer 170 slightly delayed by a delay element (not shown)), and a drain coupled to the first plate of the first n-side input capacitor $C_{DACN}$.

The NFET M5 includes a drain coupled to the second plate of the first p-side input capacitor $C_{DACP}$, a gate configured to receive the first non-complementary clock signal CK1 (e.g., from the slicer 170), and a source config-ured to receive a common mode node n1 configured to receive a common mode voltage Vcm. The NFET M6 includes a drain coupled to the second plate of the first n-side input capacitor $C_{DACN}$, a gate configured to receive the first non-complementary clock signal CK1, and a source coupled to the source of the NFET M5 coupled to the common mode voltage n1 (e.g., to also receive the common mode voltage Vcm).

The NFET M7 includes a source coupled to a second (e.g., positive) plate of the first p-side input capacitor $C_{DACP}$, a gate configured to receive the second non-complementary signal CK2 (e.g., from the slicer 170), and a drain coupled to a first (e.g., positive) input of the operational amplifier 225. The NFET M8 includes a source coupled to a second (e.g., positive) plate of the first n-side input capacitor $C_{DACN}$, a gate configured to receive the second non-comple-mentary signal CK2 (e.g., from the slicer 170), and a drain coupled to a second (e.g., positive) input of the operational amplifier 225. The positive and negative inputs of the operational amplifier 225 may be at virtual ground.

The first p-side switching device SW1P includes a first terminal configured to receive a positive component Vip of an input differential signal Vip/Vin, and a second terminal coupled to a first (e.g., negative) plate of the second p-side input capacitor $C_{IP}$. The second p-side switching device SW2P includes a first terminal coupled to the first plate of the second p-side input capacitor CI, and a second terminal (e.g., coupled to the common mode node n1) configured to receive the common mode voltage Vcm. The ON/OFF (closed/open) states of the first and second p-side switching devices SW1P and SW2P are controlled by clock signals CK1d and CK2d, respectively. The switching devices SW1P and SW2P may be implemented as switching FETs.

The third p-side switching device SW3P includes a first terminal coupled to a second (e.g., positive) plate of the second p-side input capacitor $C_{IP}$ and a second terminal (e.g., coupled to the common mode node n1) configured to receive the common mode voltage Vcm. The fourth p-side switching device SW4P includes a first terminal coupled to the second plate of the second p-side input capacitor $C_{IP}$, and a second terminal coupled to the first (e.g., positive) input of the operational amplifier 225. The ON/OFF (closed/open) states of the third and fourth p-side switching devices SW3P and SW4P are controlled by clock signals CK1 and CK2, respectively. The switching devices SW3P and SW4P may be implemented as switching FETs.

The first n-side switching device SW1N includes a first terminal configured to receive a negative component Vin of the input differential signal Vip/Vin, and a second terminal coupled to a first (e.g., negative) plate of the second n-side input capacitor $C_{IN}$. The second n-side switching device SW2N includes a first terminal coupled to the first plate of the second n-side input capacitor $C_{IN}$, and a second terminal (e.g., coupled to the common mode node n1) configured to receive the common mode voltage Vcm. The ON/OFF (closed/open) states of the first and second n-side switching devices SW1N and SW2N are controlled by clock signals CK1d and CK2d, respectively. The switching devices SW1N and SW2N may be implemented as switching FETs.

The third n-side switching device SW3N includes a first terminal coupled to a second (e.g., positive) plate of the second n-side input capacitor $C_{IN}$ and a second terminal (e.g., coupled to the common mode node n1) configured to receive the common mode voltage Vcm. The fourth n-side switching device SW4N includes a first terminal coupled to the second plate of the second n-side input capacitor $C_{IN}$, and a second terminal coupled to the second (e.g., negative) input of the operational amplifier 225. The ON/OFF (closed/open) states of the third and fourth n-side switching devices SW3N and SW4N are controlled by clock signals CK1 and CK2, respectively. The switching devices SW3N and SW4N may be implemented as switching FETs.

The p-side feedback capacitor $C_{INTP}$ is coupled between a first (e.g., negative) output and the first (e.g., positive) input of the operational amplifier 225. The n-side feedback capacitor $C_{ININ}$ is coupled between a second (e.g., positive) output and the second (e.g., negative) input of the opera-tional amplifier 225. The first and second outputs of the operational amplifier 225 are configured to generate an output differential signal Vop/Von, respectively. The opera-tion of the switched-capacitor signal integrator 200 is described with further reference to FIG. 2B.

Figure 2B:
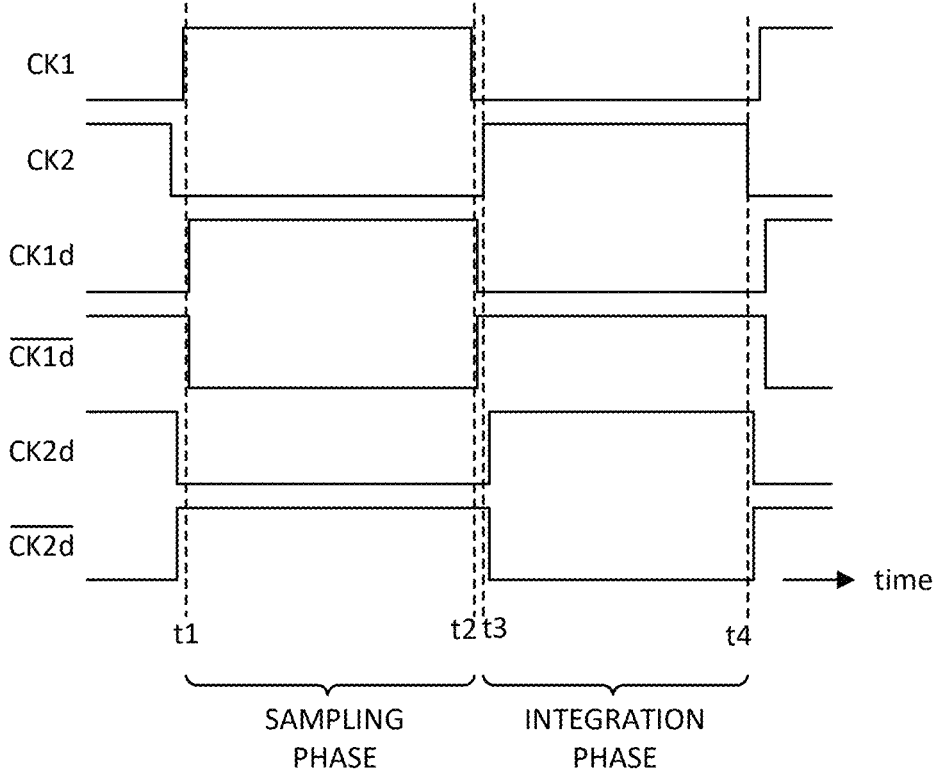
FIG. 2B illustrates a signal diagram of an example operation associated with the switched-capacitor signal integrator of FIG. 2A in accordance with another aspect of the disclosure.

FIG. 2B illustrates a signal diagram of an example opera-tion associated with the switched-capacitor signal integrator 200 in accordance with another aspect of the disclosure. The horizontal axis represents time. The vertical axis represents, from top to bottom, the states of the clock signals CK1, CK2, CK1d, $\overline{CK1d}$, CK2d, and $\overline{CK2d}$, respectively.

As previously discussed, the clock signals CK1d and CK2d are slightly delayed versions of the clock signals CK1 and CK2 for linearity purposes, respectively. However, for the sake of discussing the operation of the switched-capaci-tor signal integrator 200, the clock signals CK1d and CK2d are discussed to be substantially in-phase with the clock signals CK1 and CK2, respectively. The clock signals $\overline{CK1d}$ and $\overline{CK2d}$ are the complementary of the clock signals CK1d and CK2d, respectively. The duty cycle of the clock signals CK1d and $\overline{CK1d}$ are different from the duty cycle of CK2d and $\overline{CK2d}$ so that a sampling phase does not overlap with an integration phase of the switched-capacitor signal integrator 200.

With reference to both FIGS. 2A-2B, the sampling phase commences at time t1 and ends at time t2. At time t1, the first non-complementary clock signal CK1 transitions to a high logic state to turn on switching devices SW3P, and SW3N and NFETs M5 and M6. Also, at substantially time t1, the first delayed complementary and non-complementary clock signals $\overline{CK1d}$ and CK1d turn on PFET M1 and NFET M2/SW1P/SW1N respectively. At time t1, the second clock signal CK2 is at a low logic state to turn off switching devices SW4P, SW4N, and NFETs M7 and M8. Also, at time t1, the second delayed clock signal CK2d is at a low logic state to turn off SW2P, SW2M. NFET M3, and PFET M4. Thus, in the sampling phase between times t1 and t2, the turned-on switching devices SW1P/SW3P and SW1N/SW3N cause the second input capacitors $C_{IP}$ and $C_{IN}$ to be charged to the input differential voltage Vip/Vin, respec-tively. Similarly, the turned-on FETs M1/M5 and M2/M6 cause the first input capacitors $C_{DACP}$ and $C_{DACN}$ to be charged to the differential reference voltage Vrefp/Vrefn, respectively.

At substantially time t2, the first non-complementary clock signal CK1 transitions to a low logic state to turn off switching devices SW3P, and SW3N and NFETs M5 and M6. Also, at substantially time t2, the first delayed complementary and non-complementary clock signals $\overline{CK1d}$ and CK1d turn off PFET M1 and NFET M2/SW1P/SW1N, respectively. This completes the sampling phase of the input differential signal Vip/Vin and input differential reference voltage Vrefp/Vrefn.

The integration phase commences at time t3 and ends at time t4. At time t3, the second clock signal CK2 transitions to a high logic state to turn on switching devices SW4P, SW4N, and NFETs M7 and M8. Also, at substantially time t3, the second delayed non-complementary and complementary clock signals CK2d and $\overline{CK1d}$ and turn on NFET M3/SW2P/SW2N and PFET M4, respectively. Thus, in the integration phase between times t3 and t4, the turned-on switching devices SW2P/SW4P and SW2N/SW4N cause the Vip/Vin charged capacitors $C_{IP}/C_{IN}$ to release their charges to the integrator 220. Similarly, the turned-on FETs M3/M7 and M4/M8 cause the Vrefp/Vrefn charged capacitors $C_{DACP}$ and $C_{DACN}$ to release their charges to the integrator 220. The releasing of the charges by the capacitors $C_{IP}/C_{DACP}$, and $C_{IN}/C_{DACN}$ collectively generate the output differential voltage Vop/Von, respectively.

Figure 2C:
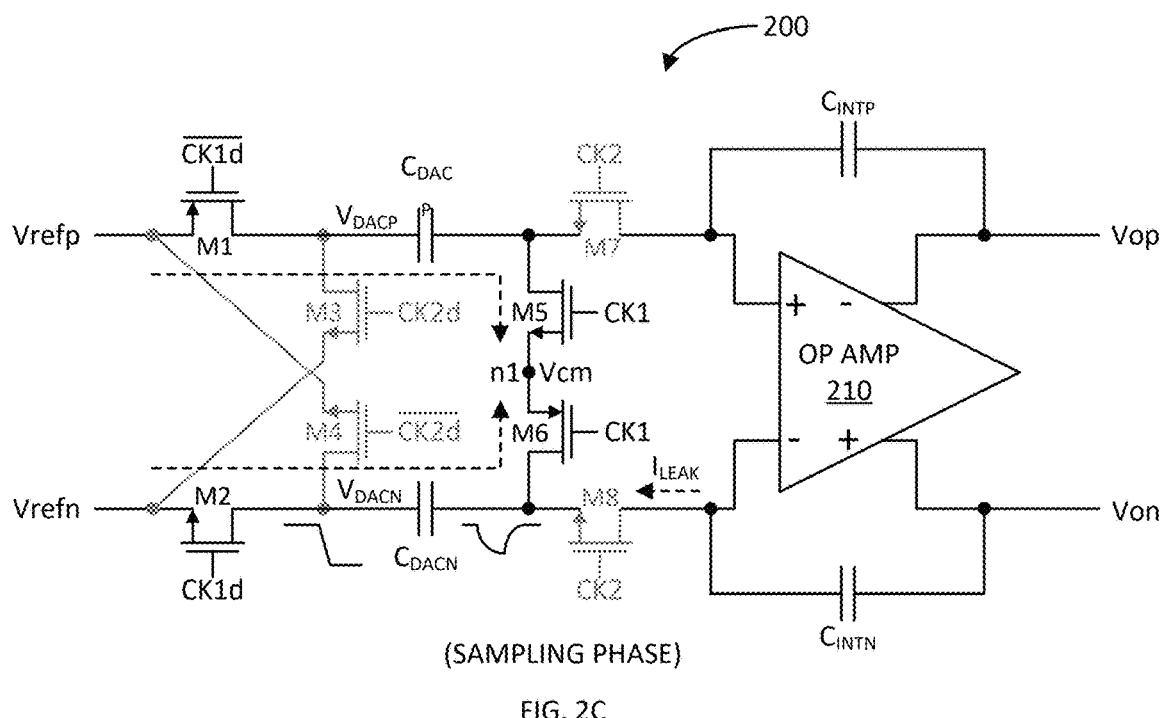
FIG. 2C illustrates a schematic diagram of the example switched-capacitor signal integrator of FIG. 2A in a sampling phase configuration in accordance with another aspect of the disclosure.

FIG. 2C illustrates a schematic diagram of an example switched-capacitor signal integrator 200 in the sampling phase configuration in accordance with another aspect of the disclosure. In the diagram, the dark schematic lines represent components and current paths that are active (turned-on or in-circuit) in the sampling phase, and the greyed schematic lines represent components and current paths that are inactive (turned-off or out-of-circuit) in the sampling phase. The reference voltages Vrefp and Vrefn are set relatively high and low with respect to each other (e.g., Vrefp=0.95 Volt (V) and Vrefn=0.05V).

Prior to the sampling phase, the voltages $V_{DACP}$ and $V_{DACN}$ at the first (e.g., negative) plates of the capacitors $C_{DACP}$ and $C_{DACN}$ are at Vrefn and Vrefp, respectively. When the FETs M1 and M2 are turned on pursuant to the sampling phase, the voltages $V_{DACP}$ and $V_{DACN}$ at the first (e.g., negative) plates of the capacitors $C_{DACP}$ and $C_{DACN}$ transition to Vrefp and Vrefn, respectively. Accordingly, as depicted, the voltage $V_{DACN}$ at the first (e.g., negative) plate of capacitor $C_{DACN}$ transitions from the relatively high voltage Vrefp to the relatively low voltage Vrefn. This falling transition causes the voltage at the second (e.g., positive) plate of the capacitor $C_{DACN}$ to droop as illustrated. The voltage droop, which is also present at the source of NFET M8, causes the NFET M8 to conduct; thereby, producing a leakage current $I_{LEAK}$ through the NFET M8 coming from the integrator 220. The leakage current $I_{LEAK}$ impacts (e.g., produces error in) the output differential voltage Vop/Von of the integrator 220.

Figure 2D:
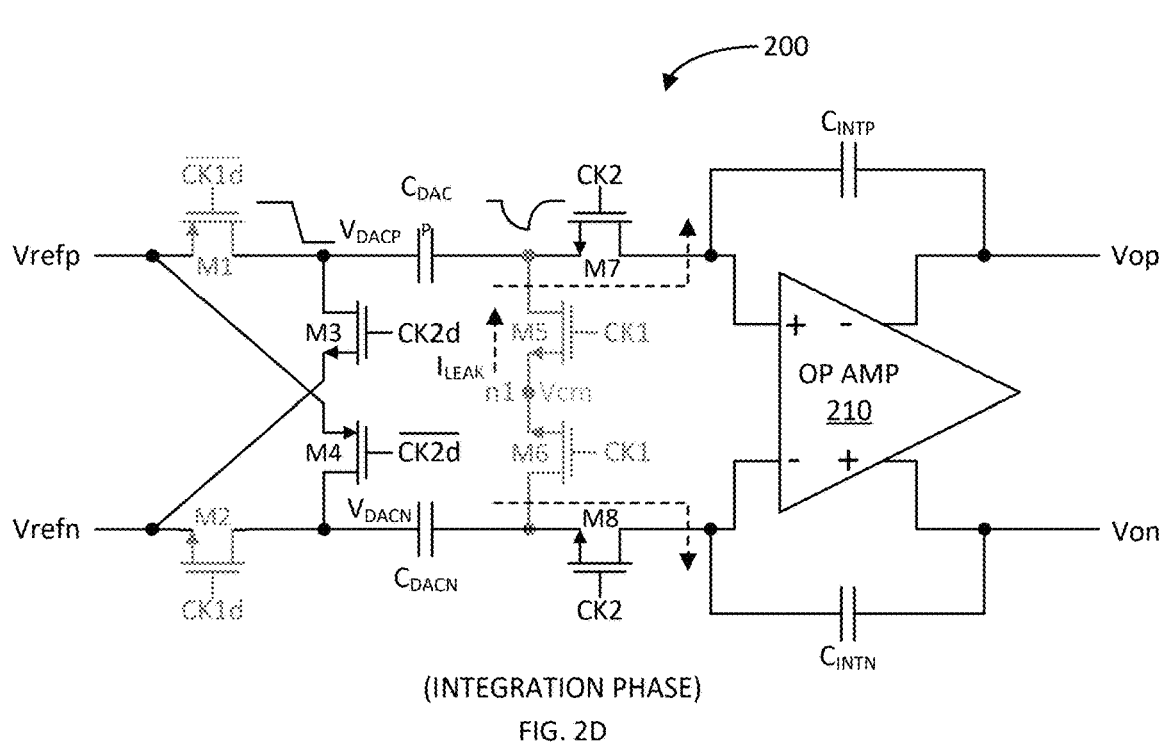
FIG. 2D illustrates a schematic diagram of the example switched-capacitor signal integrator of FIG. 2B in an integration phase configuration in accordance with another aspect of the disclosure.

FIG. 2D illustrates a schematic diagram of an example switched-capacitor signal integrator 200 in the integration phase configuration in accordance with another aspect of the disclosure. In the diagram, the dark schematic lines represent components and current paths that are active (turned-on or in-circuit) in the integration phase, and the greyed schematic lines represent components and current paths that are inactive (turned-off or out-of circuit) in the integration phase.

Prior to the integration phase, the voltages $V_{DACP}$ and $V_{DACN}$ at the first (e.g., negative) plates of the capacitors $C_{DACP}$ and $C_{DACN}$ are at Vrefp and Vrefn, respectively. When the FETs M3 and M4 are turned on pursuant to the integration phase, the voltages $V_{DACP}$ and $V_{DACN}$ at the first (e.g., negative) plates of the capacitors $C_{DACP}$ and $C_{DACN}$ transition to Vrefn and Vrefp, respectively. Accordingly, as depicted, the voltage $V_{DACP}$ at the first (e.g., negative) plate of capacitor $C_{DACP}$ transitions from the relatively high voltage Vrefp to the relatively low voltage Vrefn. This produces a voltage droop at the second (e.g., positive) plate of the capacitor $C_{DACP}$. The voltage droop causes the source voltage of the NFET M5 to decrease; and consequently, turning on NFET M5. This produces a leakage current $I_{LEAK}$ from the common mode node n1 through the NFETs M5 and M7 and into the integrator 220. The leakage current $I_{LEAK}$ impacts (e.g., produces error in) the output differential voltage Vop/Von of the integrator 220, and increases power consumption.

Figure 3:
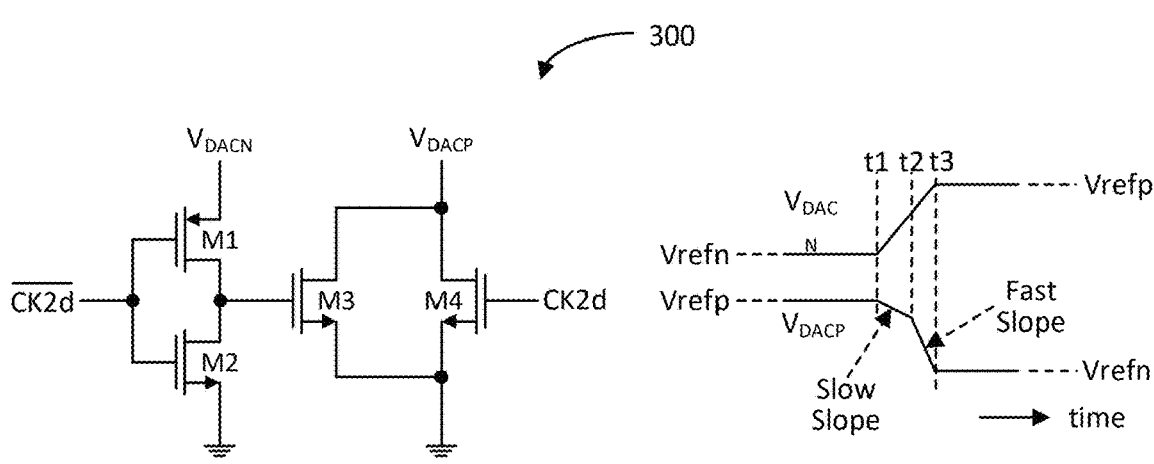
FIG. 3 illustrates a schematic diagram and associated signal diagram of an example multi-slope switching circuit in accordance with another aspect of the disclosure.

FIG. 3 illustrates a schematic diagram and associated signal diagram of an example multi-slope (e.g., dual-slope) switching circuit 300 in accordance with another aspect of the disclosure. As discussed in more detail, and with further reference to FIG. 2C, the multi-slope switching circuit 300 may be implemented to effectively reduce the rate at which the voltage $V_{DACN}$ at the first (e.g., negative) plate of the first n-side input capacitor $C_{DACN}$ transitions from Vrefp towards Vrefn during a first portion of the transition, and increase the rate at which the voltage transitions to Vrefn during a second portion of the transition. The decrease in the rate during the first transition portion reduces the droop in the voltage at the source of NFET M8, which, in turn, reduces the leakage current $I_{LEAK}$ through the NFET M8 from the integrator 220 so as to reduce the impact on the output differential voltage Vop/Von. The increase in the rate during the second transition portion causes the arrival of the voltage $V_{DACN}$ at be at substantially the same time had the transition been performed normally with a constant slope.

Similarly, with further reference to FIG. 2D, the multi-slope switching circuit 300 may be implemented to effectively reduce the rate at which the voltage $V_{DACP}$ at the first (e.g., negative) plate of the first p-side input capacitor $C_{DACP}$ transitions from Vrefp towards Vrefn during a first portion of the transition, and increase the rate at which the voltage transitions to Vrefn during a second portion of the transition. The decrease in the rate during the first transition portion reduces the droop in the voltage at the source of NFET M5, which, in turn, reduces the leakage current $I_{LEAK}$ through the NFETS M5 and M7 towards the integrator 220 so as to reduce the impact on the output differential voltage Vop/Von. The increase in the rate during the second transition portion causes the arrival of the voltage $V_{DACP}$ at be at substantially the same time had the transition been performed normally with a constant slope.

Using the voltage $V_{DACP}$ at the first (e.g., negative) plate of the capacitor $C_{DACP}$ as an example, the multi-slope switching circuit 300 is configured to control the rate at which $V_{DACP}$ transitions from Vrefp to Vrefn into a relatively slow negative slope portion and a relatively fast negative slope portion. In particular, the multi-slope switching circuit 300 includes an inverter including a PFET M1 coupled in series with an NFET M2 between the first (e.g., negative) plate of the capacitor $C_{DACN}$ (as represented by the voltage $V_{DACN}$) and substantially ground (e.g., at Vrefn). That is PFET M1 and NFET M2 include sources coupled to the $V_{DACN}$ and ground, respectively, gates configured to receive the second delayed complementary clock signal $\overline{\text{CK2}d}$, and drains coupled to a gate of an NFET M3.

The NFET M3 includes a drain coupled to the first (e.g., negative) plate of the capacitor $C_{DACP}$ (as represented by the voltage $V_{DACP}$) and a source coupled to ground. The multi-slope switching circuit 300 further includes an NFET M4 including a source coupled to $V_{DACP}$, a gate configured to receive the second delayed non-complementary clock signal $\text{CK2}d$, and a source coupled to ground. The size (e.g., channel width to length ratio (W/L)) of the NFET M4 is smaller than the size (W/L) of NFET M3 so that the NFET N4 presents a higher turn-on resistance to the capacitor $C_{DACP}$ compared to the turn-on resistance presented by the NFET M3.

The operation of the multi-slope switching circuit 300 is discussed with further reference to the graph also provided in FIG. 3 depicting the voltages $V_{DACN}$ and $V_{DACP}$ over time. Time t1 represents the start of the integration phase. Accordingly, prior to time t1, the clock signals $\text{CK2}d$ and $\overline{\text{CK2}d}$ are logically low and high, respectively. Also, the voltages $V_{DACN}$ and $V_{DACP}$ are at Vrefp and Vrefn, respectively. At time t1, the clock signal $\text{CK2}d$ goes high and turns on NFET M4. As NFET M4 has a relatively high turn-on resistance, the voltage $V_{DACP}$ transitions from Vrefp towards Vrefn with a relatively small negative slope. Also, at time t1, the clock signal $\overline{\text{CK2}d}$ goes low, enabling PFET M1, and causing $V_{DACN}$, which is low at time t1, to be applied to the gate of NFET M3. Thus, at such time t1, NFET M3 is turned off.

As illustrated, at time t1, the voltage $V_{DACN}$ begins to transition from Vrefn to Vrefp with a nominal slope. At time t2, when voltage $V_{DACN}$ reaches the threshold voltage of NFET M3, NFET M3 turns on and causes the voltage $V_{DACP}$ to transitions towards Vrefn with a relatively large negative slope as both NFETs M3 and M4 are turned on. The voltages $V_{DACP}$ and $V_{DACN}$ should reach Vrefn and Vrefp at substantially the same time t3 for desired operation of the switched-capacitor 210. Accordingly, the absolute value of the average slope of the relatively small and large negative slopes of $V_{DACP}$ should be substantially the same as the positive slope of $V_{DACN}$.

The relatively small (slow) slope of $V_{DACP}$ during a first portion (t1-t2) of the Vrefp-Vrefn transition reduces the voltage droop at the second (e.g., positive) plate of the capacitor $C_{DACP}$ to reduce the leakage current $I_{LEAK}$ through NFET M5 so as to reduce the impact of the leakage current $I_{LEAK}$ on the output differential voltage Vop/Von of the integrator 220, as discussed with reference to FIG. 2D. The relatively large (slow) slope of $V_{DACP}$ during a second portion (t2-t3) of the Vrefp-Vrefn transition causes both voltages $V_{DACP}$ and $V_{DACN}$ to reach Vrefn and Vrefp at substantially the same time for proper operation of the switched-capacitor signal integrator 200, respectively.

As discussed further herein, a similar multi-slope switching circuit 300 may be implemented at the first (e.g., negative) plate of the capacitor $C_{DACN}$ to reduce the voltage droop at the second (e.g., positive) plate of the capacitor $C_{DACN}$ so as to reduce the leakage current through NFET M8 so as to reduce the impact of the leakage current $I_{LEAK}$ on the output differential voltage Vop/Von of the integrator 220, as discussed with reference to FIG. 2C.

Figure 4:
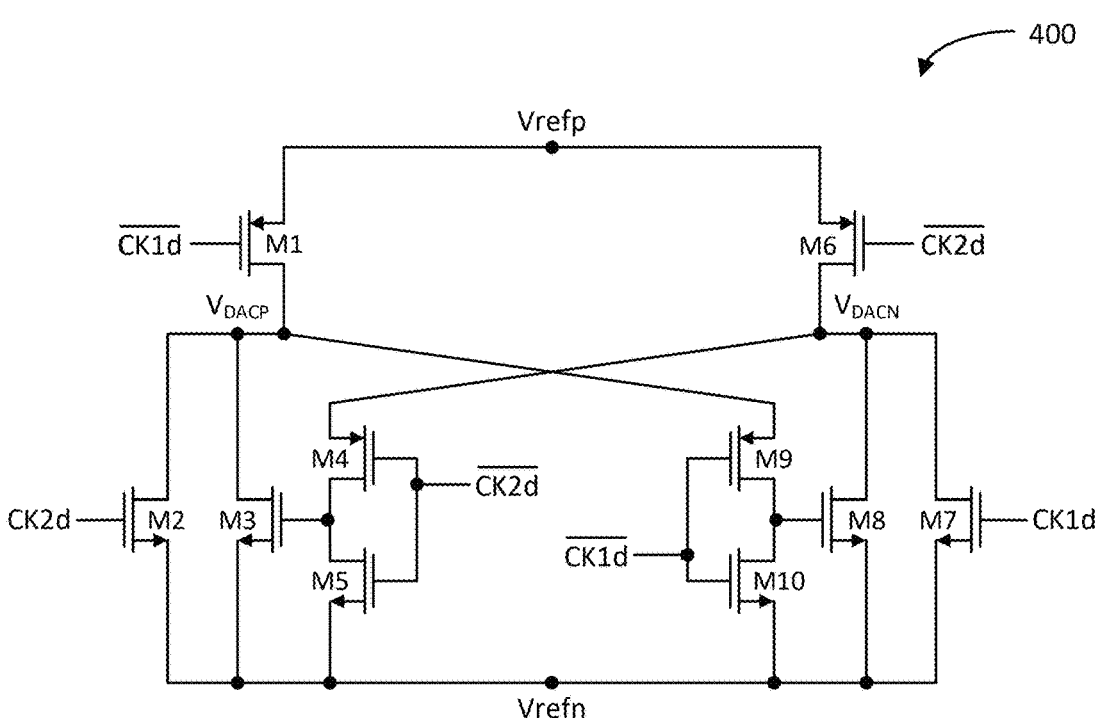
FIG. 4 illustrates a schematic diagram of an example differential multi-slope switching circuit in accordance with another aspect of the disclosure.

FIG. 4 illustrates a schematic diagram of an example differential multi-slope switching circuit 400 in accordance with another aspect of the disclosure. The differential multi-slope switching circuit 400 includes a PFET M1 including a source configured to receive the positive differential reference voltage Vrefp, a gate configured to receive the first delayed complementary clock signal $\overline{\text{CK1}d}$, and a drain coupled to the first (e.g., negative) plate of the first p-side input capacitor $C_{DACP}$ (as represented by the voltage $V_{DACP}$). The differential multi-slope switching circuit 400 further includes a PFET M6 including a source configured to receive the positive differential reference voltage Vrefp, a gate configured to receive the second delayed complementary clock signal $\overline{\text{CK2}d}$, and a drain coupled to the first (e.g., negative) plate of the first n-side input capacitor $C_{DACN}$ (as represented by the voltage $V_{DACN}$).

The differential multi-slope switching circuit 400 further includes an NFET M2 including a drain coupled to the first (e.g., negative) plate of capacitor $C_{DACP}$, a gate configured to receive the second delayed non-complementary clock signal $\text{CK2}d$, and a source configured to receive the negative differential reference voltage Vrefn. The differential multi-slope switching circuit 400 also includes an NFET M7 including a drain coupled to the first (e.g., negative) plate of capacitor $C_{DACN}$, a gate configured to receive the first delayed non-complementary clock signal $\text{CK1}d$, and a source configured to receive the negative differential reference voltage Vrefn.

The differential multi-slope switching circuit 400 further includes a first inverter including PFET M4 and NFET M5. The PFET M4 includes a source coupled to the first (e.g., negative) plate of capacitor $C_{DACN}$, a gate configured to receive the second delayed complementary clock signal $\overline{\text{CK2}d}$, and a drain coupled to a drain of NFET M5. The NFET M5 includes a gate coupled to the gate of PFET M4 and also configured to receive the second delayed complementary clock signal $\overline{\text{CK2}d}$. The NFET M5 includes a source configured to receive the negative differential reference voltage Vrefn. Additionally, the differential multi-slope switching circuit 400 includes an NFET M3 including a drain coupled to the first (e.g., negative) plate of capacitor $C_{DACP}$, a gate coupled to the output of the first inverter (e.g., drains of PFET M4 and NFET M5), and a source configured to receive the negative differential reference voltage Vrefn.

The differential multi-slope switching circuit 400 further includes a second inverter including PFET M9 and NFET M10. The PFET M9 includes a source coupled to the first (e.g., negative) plate of capacitor $C_{DACP}$, a gate configured to receive the first delayed complementary clock signal $\overline{\text{CK1}d}$, and a drain coupled to a drain of NFET M10. The NFET M10 includes a gate coupled to the gate of PFET M9 and also configured to receive the first delayed complementary clock signal $\overline{\text{CK1}d}$. The NFET M10 includes a source configured to receive the negative differential reference voltage Vrefn. Additionally, the differential multi-slope switching circuit 400 includes an NFET M8 including a drain coupled to the first (e.g., negative) plate of capacitor $C_{DACN}$, a gate coupled to the output of the second inverter (e.g., drains of PFET M9 and NFET M10), and a source configured to receive the negative differential reference voltage Vrefn.

The NFET M7 is configured to produce a relatively small (slow) negative slope of the voltage $V_{DACN}$ during a first portion of its transition from Vrefp to Vrefn at the start of the sampling phase. The NFETs M7 and M8 are collectively configured to produce a relatively large (fast) negative slope of the voltage $V_{DACN}$ during a second portion of its transition from Vrefp to Vrefn. Accordingly, the size (W/L) of the NFET M7 is smaller than the size (W/L) of the NFET M8 so that the NFET M7 presents a higher turn-on resistance to the first (e.g., negative) plate of capacitor $C_{DACN}$ compared to the turn-on resistance of the NFET M8 presented to the first (e.g., negative) plate of capacitor $C_{DACN}$.

Similarly, the NFET M2 is configured to produce a relatively small (slow) negative slope of the voltage $V_{DACP}$ during a first portion of its transition from Vrefp to Vrefn at the start of the integration phase. The NFETs M2 and M3 are collectively configured to produce a relatively large (fast) negative slope of the voltage $V_{DACP}$ during a second portion of its transition from Vrefp to Vrefn. Accordingly, the size (W/L) of the NFET M2 is smaller than the size (W/L) of the NFET M3 so that the NFET M2 presents a higher turn-on resistance to the first (e.g., negative) plate of capacitor $C_{DACP}$ compared to the turn-on resistance of the NFET M3 presented to the first (e.g., negative) plate of capacitor $C_{DACP}$.

In operation, prior to the start of the sampling phase, the voltages $V_{DACP}$ and $V_{DACN}$ are substantially at Vrefn and Vrefp, respectively. At the start of the sampling phase at time t1, the first non-complementary clock signal CK1$d$ transitions to a high logic voltage (e.g., Vrefp) to turn on NFET M7. As the NFET M7 has a relatively high turn-on resistance, the voltage $V_{DACN}$ transitions from Vrefp towards Vrefn with a relatively small (slow) negative slope during a first interval t1-t2. At substantially the same time t1, the first complementary clock signal CK1$d$ transitions to a low logic voltage (e.g., Vrefn) to turn on PFET M1 and enable PFET M9. The turning on of PFET M1 causes the voltage $V_{DACP}$ to transition from Vrefn towards Vrefp. When the voltage $V_{DACP}$ causes the gate-to-source voltage Vgs of the PFET M9 to exceed its threshold level at time t2, the PFET M9 turns on and applies the voltage $V_{DACP}$ to the gate of NFET M8 to turn on NFET M8. Thus, the NFET M8, having a lower turn-on resistance than NFET M7, collectively with NFET M7 cause the voltage $V_{DACN}$ to transitions to Vrefn with a relatively large (fast) negative slope during a second interval t2-t3.

At the start of the integration phase at time t4, the second non-complementary clock signal CK2$d$ transitions to a high logic voltage (e.g., Vrefp) to turn on NFET M2. As the NFET M2 has a relatively high turn-on resistance, the voltage $V_{DACP}$ transitions from Vrefp towards Vrefn with a relatively small (slow) negative slope during a first interval t4-t5. At substantially the same time t5, the second complementary clock signal CK2$d$ transitions to a low logic voltage (e.g., Vrefn) to turn on PFET M6 and enable PFET M4. The turning on of PFET M6 causes the voltage $V_{DACN}$ to transition from Vrefn towards Vrefp. When the voltage $V_{DACN}$ causes the gate-to-source voltage Vgs of the PFET M4 to exceed its threshold level at time t5, the PFET M4 turns on and applies the voltage $V_{DACN}$ to the gate of NFET M3 to turn on NFET M3. Thus, the NFET M3, having a lower turn-on resistance than NFET M2, collectively with NFET M2 cause the voltage $V_{DACP}$ to transitions to Vrefn with a relatively large (fast) negative slope during a second interval t5-t6.

Figure 5:
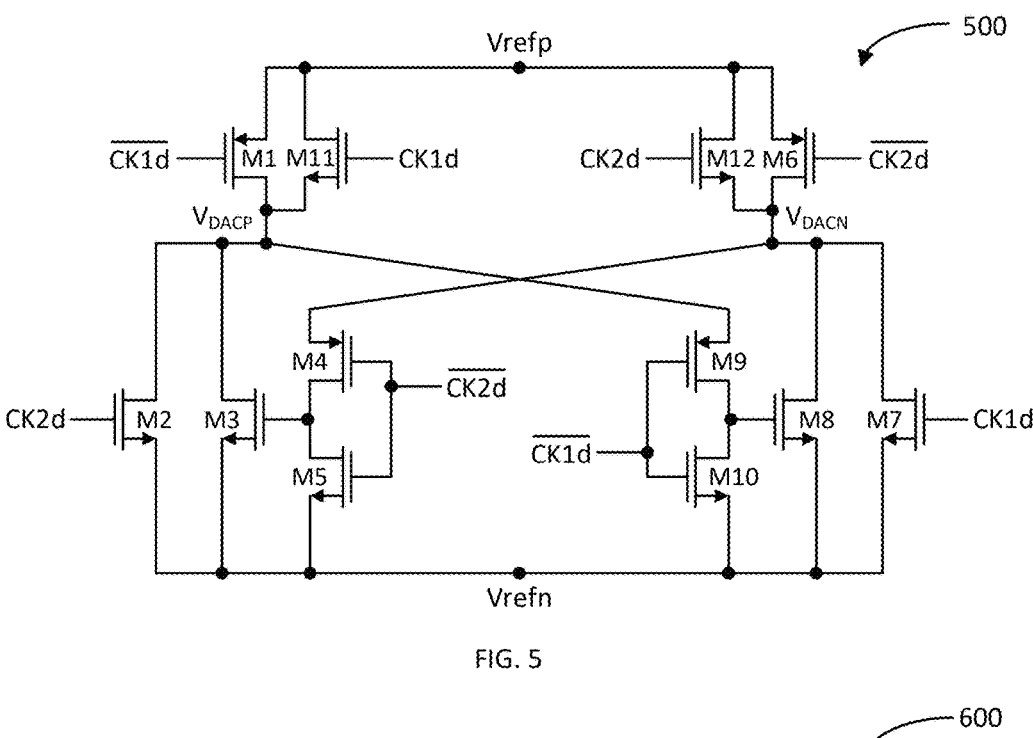
FIG. 5 illustrates a schematic diagram of another example differential multi-slope switch in accordance with another aspect of the disclosure.

FIG. 5 illustrates a schematic diagram of another example differential multi-slope switching circuit 500 in accordance with another aspect of the disclosure. The differential multi-slope switching circuit 500 is similar to differential multi-slope switching circuit 400 but further includes NFETs M11 and M12. The NFET M11 includes a drain configured to receive the positive differential reference voltage Vrefp, a gate configured to receive the first delayed non-complementary clock signal CK1$d$, and a source coupled to the first (e.g., negative) plate of the capacitor $C_{DACP}$. The NFET M12 includes a drain configured to receive the positive differential reference voltage Vrefp, a gate configured to receive the second delayed non-complementary clock signal CK2$d$, and a source coupled to the first (e.g., negative) plate of the capacitor $C_{DACN}$.

The NFET M11 may be provided to ensure that the rise of the voltage $V_{DACP}$ begins substantially at the same time as the fall of the voltage $V_{DACN}$ as both NFETs M11 and M7 are responsive to the same clock signal CK1$d$. If NFET M11 were not present, the rise of the voltage $V_{DACP}$ may begin at a different time as the fall of the voltage $V_{DACN}$ as PFET M1 and NFET M7 are responsive to different clock signals CK1$d$ and $\overline{CK1d}$ (which may not be exactly complementary to each other), respectively. Similarly, the NFET M12 may be provided to ensure that the rise of the voltage $V_{DACN}$ begins substantially at the same time as the fall of the voltage $V_{DACP}$ as both NFETs M12 and M7 are responsive to the same clock signal CK2$d$. If NFET M12 were not present, the rise of the voltage $V_{DACN}$ may begin at a different time as the fall of the voltage $V_{DACP}$ as PFET M6 and NFET M2 are responsive to different clock signals $\overline{CK2d}$ and CK2$d$ which may not be exactly complementary to each other), respectively.

Figure 6:
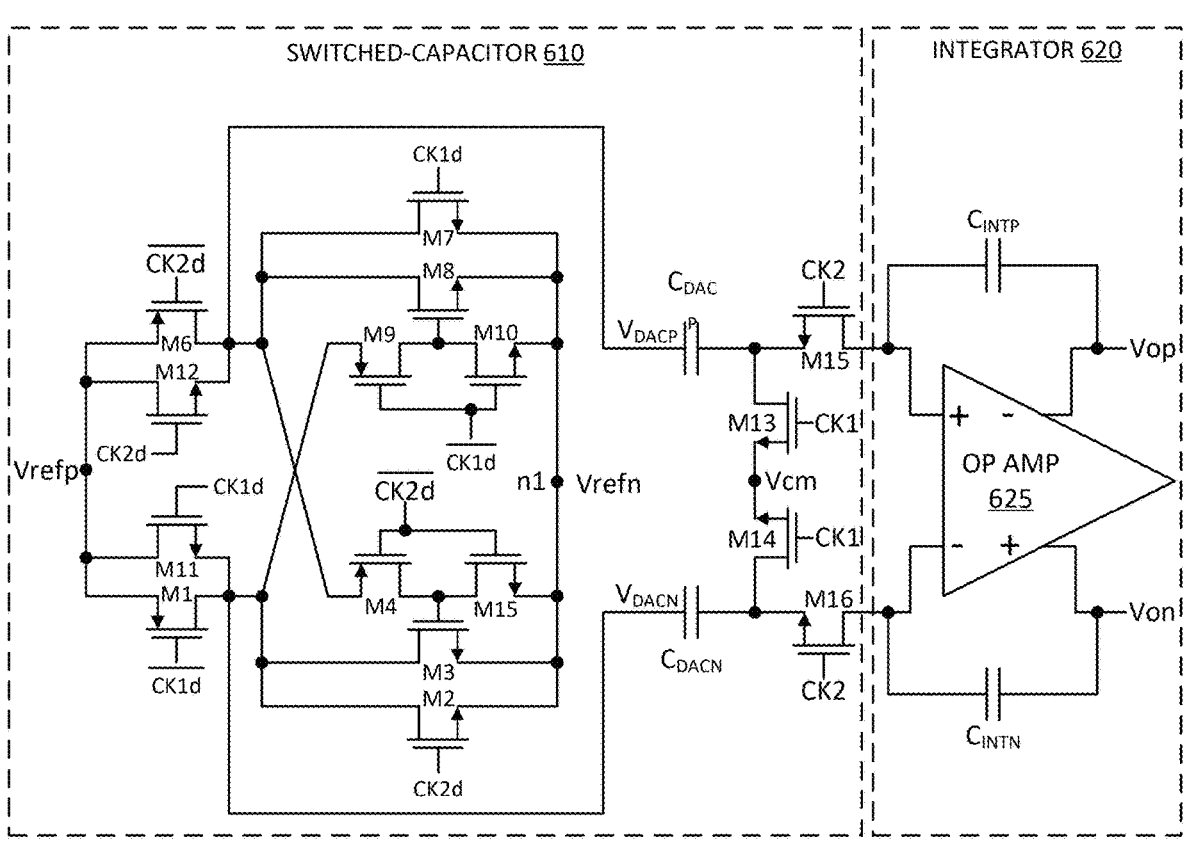
FIG. 6 illustrates a schematic diagram of an example switched-capacitor signal integrator in accordance with another aspect of the disclosure.

FIG. 6 illustrates a schematic diagram of another switched-capacitor signal integrator 600 in accordance with another aspect of the disclosure. The switched-capacitor signal integrator 600 includes a switched-capacitor 610 and an integrator 620. The switched-capacitor 610 includes the multi-slope switching circuit 500 including FETs M1-M12 in the same arrangement as the corresponding FETs M1-M12 in multi-slope switching circuit 500. The switched-capacitor 610 further includes the first p-side and n-side input capacitors $C_{DACP}$ and $C_{DACN}$, and NFETs M13-M16 in the same arrangement as NFETs M5-M8 of switched-capacitor 210. Also, similarly, the integrator 620 is similar to integrator 220 including an operational amplifier 625 and differential feedback capacitors $C_{INTP}/C_{ININ}$ in the same arrangement.

Figure 7:
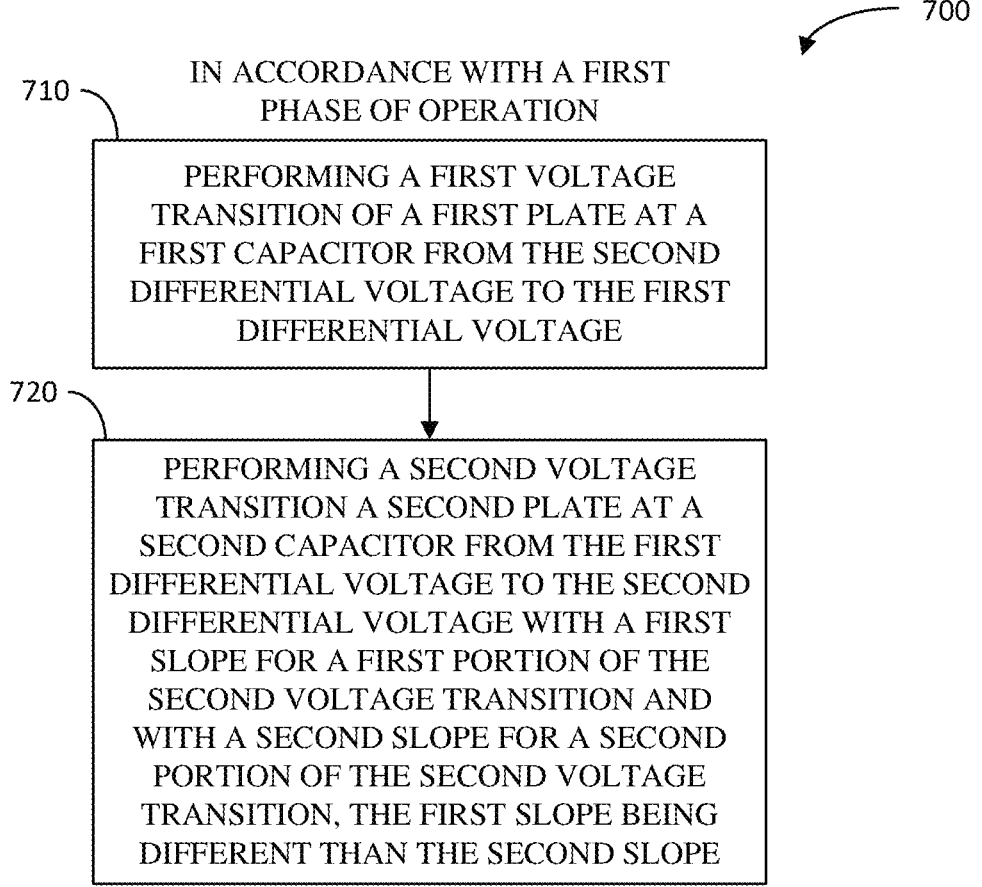
FIG. 7 illustrates an example method of processing first and second differential voltages in accordance with another aspect of the disclosure.

FIG. 7 illustrates an example method 700 of processing first and second differential voltages in accordance with another aspect of the disclosure. The method 700 includes, in accordance with a first phase of operation: performing a first voltage transition at a first plate of a first capacitor from the second differential voltage to the first differential voltage (block 710). Examples of means for performing a first voltage transition at a first plate of a first capacitor from the second differential voltage to the first differential voltage include any of the PFET M1 or M6 of differential multi-slope switching circuit 400 or any of the FETs M1/M11 or M6/M12 of differential multi-slope switching circuit 500.

Further, in accordance with the first phase of operation, the method 700 includes performing a second voltage transition at a second plate of a second capacitor from the first differential voltage to the second differential voltage with a first slope for a first portion of the second voltage transition and with a second slope for a second portion of the second voltage transition, the first slope being different than the second slope (block 720). Examples of means for performing a second voltage transition at a second plate of a second capacitor from the first differential voltage to the second differential voltage with a first slope for a first portion of the second voltage transition and with a second slope for a second portion of the second voltage transition, the first slope being different than the second slope, includes the NFETs M2/M3 and M7/M8 of differential multi-slope switching circuit 400 or 500.

The following provides an overview of aspects of the present disclosure:

Aspect 1: An apparatus, comprising: an integrator including a first input and a second input; and a switched-capacitor, comprising: a first capacitor; a first multi-slope switching circuit coupled to a first plate of the first capacitor; a first switching device coupled between a second plate of the first capacitor and a common mode node; a second switching device coupled between the second plate of the first capacitor and the first input of the integrator; a second capacitor; a second multi-slope switching circuit coupled to a first plate of the second capacitor; a third switching device coupled between a second plate of the second capacitor and the common mode node; and a fourth switching device coupled between the second plate of the second capacitor and the second input of the integrator.

Aspect 2: The apparatus of aspect 1, wherein: the first multi-slope switching circuit comprises fifth, sixth, and seventh switching devices, wherein the fifth switching device is coupled between a first reference voltage input and the first plate of the first capacitor, wherein the sixth and seventh switching devices are coupled in parallel between the first plate of the first capacitor and a second reference voltage input; and the second multi-slope switching circuit comprises eighth, ninth, and tenth switching devices, wherein the eighth switching device is coupled between the first reference voltage input and the first plate of the second capacitor, wherein the ninth and tenth switching devices are coupled in parallel between the first plate of the second capacitor and the second reference voltage input.

Aspect 3: The apparatus of aspect 2, wherein: the fifth switching device comprises a first p-channel field effect transistor (PFET) including a gate configured to receive a first clock signal; and the eighth switching device comprises a second PFET including a gate configured to receive a second clock signal.

Aspect 4: The apparatus of aspect 3, wherein: the first multi-slope switching circuit further comprises a first n-channel field effect transistor (NFET) coupled between the first reference voltage input and the first plate of the first capacitor, wherein the first NFET is configured to receive a third clock signal; and the second multi-slope switching circuit further comprises a second NFET coupled between the first reference voltage input and the first plate of the second capacitor, wherein the first NFET is configured to receive a fourth clock signal.

Aspect 5: The apparatus of aspect 4, wherein: the first clock signal is substantially complementary of the third clock signal; and the second clock signal is substantially complementary of the fourth clock signal.

Aspect 6: The apparatus of aspect 2, wherein: the fifth switching device comprises a first n-channel field effect transistor (NFET) including a gate configured to receive a first clock signal; and the eighth switching device comprises a second NFET including a gate configured to receive a second clock signal.

Aspect 7: The apparatus of any one of aspects 2-6, wherein: the sixth switching device comprises a first n-channel field effect transistor (NFET); the seventh switching device comprises a second NFET; the ninth switching device comprises a third NFET; and the tenth switching device comprises a fourth NFET.

Aspect 8: The apparatus of aspect 7, wherein: the first NFET has a channel width to length ratio (W/L) less than a W/L of the second NFET; and the third NFET has a W/L less than a W/L of the fourth NFET.

Aspect 9: The apparatus of aspect 7 or 8, wherein: the first NFET includes a gate configured to receive a first clock signal; the first multi-slope switching circuit comprises a first inverter coupled between the first plate of the second capacitor and the second reference voltage input, wherein the first inverter includes an input configured to receive a second clock signal, and an output coupled to a gate of the second NFET; the third NFET includes a gate configured to receive a third clock signal; and the second multi-slope switching circuit comprises a second inverter coupled between the first plate of the first capacitor and the second reference voltage input, wherein the second inverter is configured to receive a fourth clock signal, and wherein the second inverter includes an output coupled to a gate of the fourth NFET.

Aspect 10: The apparatus of aspect 9, wherein: the first clock signal is substantially complementary of the second clock signal; and the third clock signal is substantially complementary of the fourth clock signal.

Aspect 11: The apparatus of any one of aspects 1-9, wherein: the first switching device comprises a first n-channel field effect transistor (NFET) including a gate configured to receive a clock signal; and the third switching device comprises a second NFET including a gate configured to receive the clock signal.

Aspect 12: The apparatus of any one of aspects 1-10, wherein: the second switching device comprises a first n-channel field effect transistor (NFET) including a gate configured to receive a clock signal; and the fourth switching device comprises a second NFET including a gate configured to receive the clock signal.

Aspect 13: The apparatus of any one of aspects 1-12, wherein the integrator comprises: an operational amplifier including the first and second inputs; a first feedback capacitor coupled between a first output and the first input of the operational amplifier; and a second feedback capacitor coupled between a second output and the second input of the operational amplifier.

Aspect 14: The apparatus of any one of aspects 1-13, wherein the switched-capacitor further comprises: a third capacitor; a fifth switching device coupled between a first signal input and a first plate of the third capacitor; a sixth switching device coupled between the first plate of the third capacitor and the common mode node; a seventh switching device coupled between the second plate of the third capacitor and the common mode node; an eighth switching device coupled between the second plate of the third capacitor and the first input of the integrator; a fourth capacitor; a ninth switching device coupled between a second signal input and a first plate of the fourth capacitor; a tenth switching device coupled between the first plate of the fourth capacitor and the common mode node; an eleventh switching device coupled between the second plate of the fourth capacitor and the common mode node; and a twelfth switching device coupled between the second plate of the fourth capacitor and the second input of the integrator.

Aspect 15: A method of processing first and second differential voltages, comprising: in accordance with a first phase of operation: performing a first voltage transition at a first plate of a first capacitor from the second differential voltage to the first differential voltage; and performing a second voltage transition at a second plate of a second capacitor from the first differential voltage to the second differential voltage with a first slope for a first portion of the second voltage transition and with a second slope for a second portion of the second voltage transition, the first slope being different than the second slope.

Aspect 16: The method of aspect 15, wherein the first and second differential voltages comprise first and second reference voltages, respectively.

Aspect 17: The method of aspect 15 or 16, wherein the first differential voltage is higher than the second differential voltage.

Aspect 18: The method of any one of aspects 15-17, wherein the first slope has a lesser negative slope than the second slope.

Aspect 19: The method of any one of aspects 15-18, wherein performing the second voltage transition comprises: turning on a first field effect transistor (FET) coupled between the first plate of the second capacitor and an input for the second differential voltage during the first portion of the second voltage transition; and turning on a second FET coupled between the first plate of the second capacitor and the input for the second differential voltage during the second portion of the second voltage transition.

Aspect 20: The method of any one of aspects 15-19, where in accordance with a second phase of operation: performing a third voltage transition of the first plate of the first capacitor from the first differential voltage to the second differential voltage with a third slope for a first portion of the third voltage transition and with a fourth slope for a second portion of the third voltage transition, the third slope being different than the fourth slope; and performing a fourth voltage transition at the second plate of the second capacitor from the second differential voltage to the first differential voltage.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
an integrator including a first input and a second input; and
a switched-capacitor, comprising:
a first capacitor;
a first multi-slope switching circuit coupled to a first plate of the first capacitor;
a first switching device coupled between a second plate of the first capacitor and a common mode node;
a second switching device coupled between the second plate of the first capacitor and the first input of the integrator;
a second capacitor;
a second multi-slope switching circuit coupled to a first plate of the second capacitor;
a third switching device coupled between a second plate of the second capacitor and the common mode node; and
a fourth switching device coupled between the second plate of the second capacitor and the second input of the integrator.

2. The apparatus of claim 1, wherein:
the first multi-slope switching circuit comprises fifth, sixth, and seventh switching devices, wherein the fifth switching device is coupled between a first reference voltage input and the first plate of the first capacitor, wherein the sixth and seventh switching devices are coupled in parallel between the first plate of the first capacitor and a second reference voltage input; and

16 the second multi-slope switching circuit comprises eighth, ninth, and tenth switching devices, wherein the eighth switching device is coupled between the first reference voltage input and the first plate of the second capacitor, wherein the ninth and tenth switching devices are coupled in parallel between the first plate of the second capacitor and the second reference voltage input.

3. The apparatus of claim 2, wherein:
the fifth switching device comprises a first p-channel field effect transistor (PFET) including a gate configured to receive a first clock signal; and
the eighth switching device comprises a second PFET including a gate configured to receive a second clock signal.

4. The apparatus of claim 3, wherein:
the first multi-slope switching circuit further comprises a first n-channel field effect transistor (NFET) coupled between the first reference voltage input and the first plate of the first capacitor, wherein the first NFET is configured to receive a third clock signal; and
the second multi-slope switching circuit further comprises a second NFET coupled between the first reference voltage input and the first plate of the second capacitor, wherein the first NFET is configured to receive a fourth clock signal.

5. The apparatus of claim 4, wherein:
the first clock signal is substantially complementary of the third clock signal; and
the second clock signal is substantially complementary of the fourth clock signal.

6. The apparatus of claim 2, wherein:
the fifth switching device comprises a first n-channel field effect transistor (NFET) including a gate configured to receive a first clock signal; and
the eighth switching device comprises a second NFET including a gate configured to receive a second clock signal.

7. The apparatus of claim 2, wherein:
the sixth switching device comprises a first n-channel field effect transistor (NFET);
the seventh switching device comprises a second NFET;
the ninth switching device comprises a third NFET; and
the tenth switching device comprises a fourth NFET.

8. The apparatus of claim 7, wherein:
the first NFET has a channel width to length ratio (W/L) less than a W/L of the second NFET; and
the third NFET has a W/L less than a W/L of the fourth NFET.

9. The apparatus of claim 7, wherein:
the first NFET includes a gate configured to receive a first clock signal;
the first multi-slope switching circuit comprises a first inverter coupled between the first plate of the second capacitor and the second reference voltage input, wherein the first inverter includes an input configured to receive a second clock signal, and an output coupled to a gate of the second NFET;
the third NFET includes a gate configured to receive a third clock signal; and
the second multi-slope switching circuit comprises a second inverter coupled between the first plate of the first capacitor and the second reference voltage input, wherein the second inverter is configured to receive a fourth clock signal, and wherein the second inverter includes an output coupled to a gate of the fourth NFET.

10. The apparatus of claim 9, wherein:

the first clock signal is substantially complementary of the second clock signal; and the third clock signal is substantially complementary of the fourth clock signal.

11. The apparatus of claim 1, wherein:

the first switching device comprises a first n-channel field effect transistor (NFET) including a gate configured to receive a clock signal; and the third switching device comprises a second NFET including a gate configured to receive the clock signal.

12. The apparatus of claim 1, wherein:

the second switching device comprises a first n-channel field effect transistor (NFET) including a gate configured to receive a clock signal; and the fourth switching device comprises a second NFET including a gate configured to receive the clock signal.

13. The apparatus of claim 1, wherein the integrator comprises:

an operational amplifier including the first input and the second input;

a first feedback capacitor coupled between a first output and the first input of the operational amplifier; and a second feedback capacitor coupled between a second output and the second input of the operational amplifier.

14. The apparatus of claim 1, wherein the switched-capacitor further comprises:

a third capacitor;

a fifth switching device coupled between a first signal input and a first plate of the third capacitor;

a sixth switching device coupled between the first plate of the third capacitor and the common mode node;

a seventh switching device coupled between the second plate of the third capacitor and the common mode node;

an eighth switching device coupled between the second plate of the third capacitor and the first input of the integrator;

a fourth capacitor;

a ninth switching device coupled between a second signal input and a first plate of the fourth capacitor;

a tenth switching device coupled between the first plate of the fourth capacitor and the common mode node;

an eleventh switching device coupled between the second plate of the fourth capacitor and the common mode node; and a twelfth switching device coupled between the second plate of the fourth capacitor and the second input of the integrator.

15. A method of processing first and second differential voltages, comprising:

in accordance with a first phase of operation:

performing a first voltage transition at a first plate of a first capacitor from the second differential voltage to the first differential voltage; and performing a second voltage transition at a second plate of a second capacitor from the first differential voltage to the second differential voltage with a first slope for a first portion of the second voltage transition and with a second slope for a second portion of the second voltage transition, the first slope being different than the second slope.

16. The method of claim 15, wherein the first and second differential voltages comprise first and second reference voltages, respectively.

17. The method of claim 15, wherein the first differential voltage is higher than the second differential voltage.

18. The method of claim 15, wherein the first slope has a smaller negative slope than the second slope.

19. The method of claim 15, wherein performing the second voltage transition comprises:

turning on a first field effect transistor (FET) coupled between the first plate of the second capacitor and an input for the second differential voltage during the first portion of the second voltage transition; and turning on a second FET coupled between the first plate of the second capacitor and the input for the second differential voltage during the second portion of the second voltage transition.

20. The method of claim 15, where in accordance with a second phase of operation:

performing a third voltage transition of the first plate of the first capacitor from the first differential voltage to the second differential voltage with a third slope for a first portion of the third voltage transition and with a fourth slope for a second portion of the third voltage transition, the third slope being different than the fourth slope; and performing a fourth voltage transition at the second plate of the second capacitor from the second differential voltage to the first differential voltage.

* * * * *